United States Patent [19]

Ayukawa et al.

[11] Patent Number: 5,217,912
[45] Date of Patent: Jun. 8, 1993

[54] METHOD FOR MANUFACTURING A SEMICONDUCTOR DEVICE

[75] Inventors: Akitsu Ayukawa; Hiroshi Ishihara, both of Tenri; Shigeo Onishi, Nara, all of Japan

[73] Assignee: Sharp Kabushiki Kaisha, Osaka, Japan

[21] Appl. No.: 723,217

[22] Filed: Jun. 28, 1991

[30] Foreign Application Priority Data

Jul. 3, 1990 [JP] Japan .................................. 2-178154
Dec. 20, 1990 [JP] Japan .................................. 2-418151

[51] Int. Cl.$^5$ ........................................ H01L 21/265
[52] U.S. Cl. ........................................ 437/41; 437/228; 437/236; 437/247
[58] Field of Search ............... 437/41, 25, 228, 236, 437/247; 148/DIG. 24

[56] References Cited

U.S. PATENT DOCUMENTS

| | | | |
|---|---|---|---|
| 4,605,447 | 8/1986 | Brotherton et al. | 148/DIG. 24 |
| 4,786,609 | 11/1988 | Chen | 437/41 |
| 5,015,593 | 5/1991 | Yawata et al. | 437/25 |

Primary Examiner—Brian E. Hearn
Assistant Examiner—Tuan Nguyen
Attorney, Agent, or Firm—Nixon & Vanderhye

[57] ABSTRACT

A method for manufacturing a semiconductor device providing steps of implanting impurity ions on the whole surface of a semiconductor substrate having a plurality of gate portions, in which side walls are formed on gate electrodes, by using the gate portions as masks, and then laminating a first insulating film, carrying out a first heat treatment to diffuse the impurities implanted in the substrate and to form an impurity diffusion layer between the gate portions, removing the first insulating film in a contact formation region which substantially includes the impurity diffusion layer, carrying out a second heat treatment to reduce crystal defects on the impurity diffusion layer and to laminate a second insulating film, which is made of the same material as that of the first insulating film, on the whole surface of the semiconductor substrate including the contact formation region again, and laminating a third insulating film on the whole surface and then carrying out a third heat treatment to flatten the surface.

5 Claims, 6 Drawing Sheets

METHOD FOR MANUFACTURING A SEMICONDUCTOR DEVICE

BACKGROUND OF THE INVENTION

1. Field of the Invention

The present invention relates to a method for manufacturing a semiconductor device, and more particularly to a method for forming a source-drain impurity diffusion region by implanting As ions in a MOS memory cell having a LDD (Lightly Doped Drain) structure.

2. Description of the Prior Art

Conventionally, there has been proposed a method for manufacturing a MOS memory cell shown in FIG. 5 as one of methods for forming a gate construction having a LDD structure.

As shown in FIG. 5 (a), a gate electrode (53) is formed on a Si substrate (51) through a gate oxide film (52). A $SiO_2$ film as a side wall material is deposited on the gate electrode (53). RIE is carried out to form a $SiO_2$ side wall (54).

Then, As ions (55) are implanted as impurities on the whole surface. A NSG film (56) is deposited in order to prevent out diffusion. Thereafter, a heat treatment is carried out for 60 minutes at a middle temperature, for example, of about 800° C. so as to diffuse the impurities. Consequently, an impurity diffusion layer (51a) is formed [see FIG. 5 (b)].

A BPSG film (58) is deposited on the whole surface in order to reduce a level difference between layers. The heat treatment is carried out for 30 minutes at a high temperature, for example, of about 950° C. so as to adjust a shape. Thus, the surface is made flat [see FIG. 5 (c)].

Then, a contact hole is formed for metal wiring, so that an element is produced.

There has been proposed another method for forming an impurity diffusion layer (51a). More specifically, As ions (55) are implanted [see FIG. 6 (a)]. A middle temperature heat treatment is carried out for impurity diffusion. A NSG film (56) is deposited in order to prevent out diffusion. Then, a BPSG film (58) is deposited so as to reduce a level difference between layers. Thereafter, a high temperature heat treatment is carried out in order to adjust a shape [see FIG. 6 (b)].

Referring to a prior art shown in FIG. 6, especially, oxide in a $SiO_2$ film (60) is implanted in the Si substrate (51) together with the As ions (55). Consequently, crystal defects occur on the Si substrate (51). Also in the case where the middle temperature heat treatment is carried out to form the impurity diffusion region (51a), the crystal defects are not eliminated.

Referring to a prior art shown in FIG. 5, when the middle temperature heat treatment is carried out to form the impurity diffusion region (51a), crystal defects (59) occur owing to the cluster of impurities introduced into the impurity diffusion region (51a). Thus, an electric leak is caused so that a yield may be reduced.

SUMMARY OF THE INVENTION

The present invention provides a method for manufacturing a semiconductor device comprising steps of (i) implanting impurity ions on the whole surface of a semiconductor substrate having a plurality of gate portions, in which side walls are formed on gate electrodes, by using the gate portions as masks, and then laminating a first insulating film, (ii) carrying out a first heat treatment to diffuse the impurities implanted in the substrate and to form an impurity diffusion layer between the gate portions, (iii) removing the first insulating film in a contact formation region which substantially includes the impurity diffusion layer, (iv) carrying out a second heat treatment to reduce crystal defects on the impurity diffusion layer and to laminate a second insulating film, which is made of the same material as that of the first insulating film, on the whole surface of the semiconductor substrate including the contact formation region again, and (v) laminating a third insulating film on the whole surface and then carrying out a third heat treatment to flatten the surface.

From another aspect, the present invention provides a method for manufacturing a semiconductor device comprising steps of implanting As ions in a semiconductor substrate having side walls between two gates and a $SiO_2$ film as an ion implantation mask and then carrying out middle temperature annealing, removing the $SiO_2$ film in an ion implantation mask portion, and forming a SiN film by using silane compound gas containing chlorine such as $SiH_2Cl_2$, or implanting Cl ions and then carrying out high temperature annealing so as to reduce crystal defects in an As ion implantation layer.

DETAILED DESCRIPTION OF PREFERRED EMBODIMENTS

Figure 1A:
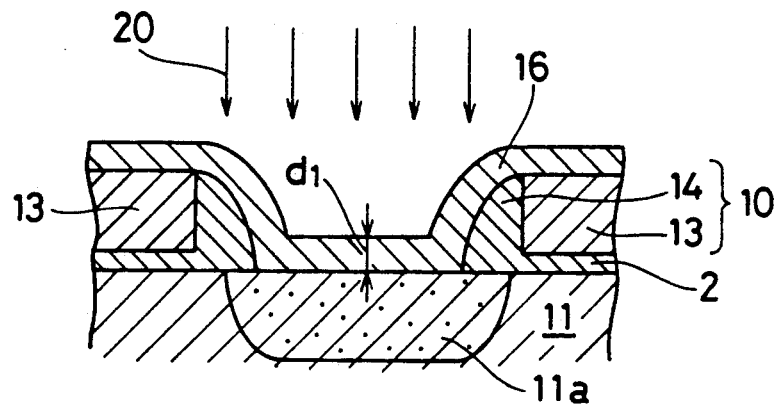
FIGS. 1(a)–1(c) are diagrams for explaining manufacturing steps according to a first embodiment of the present invention.

A manufacturing method of the present invention is characterized by the following. More specifically, in the case where an impurity diffusion layer is to be formed on a semiconductor substrate by ion implantation and a heat treatment.

(A) an insulating film, which should at least cover an impurity diffusion region, is removed to prevent the out diffusion of impurities and then the heat treatment is carried out, and (B) silicon oxide in an ion implantation mask portion is removed and then Cl ions are implanted in the impurity diffusion region.

From another aspect, the present invention is characterized in that (C) a SiN film containing a lot of nitrogen elements, i.e., a N-rich SiN film is deposited on an impurity diffusion layer formation region and then high temperature annealing is carried out to form the impurity diffusion layer having no crystal defects.

According to the present invention, there are utilized well-known means such as a method for forming first and second insulating films (for example, NSG films) to prevent the out diffusion of the impurities, or forming a SiN film by using silane compound gas containing chlorine such as $SiH_2Cl_2$, middle and high temperature heat treatment methods as first and second heat treatments for forming an impurity diffusion layer after ion implantation, and a high temperature heat treatment method as a third heat treatment for flattening. In addition, there are used a method for etching the first insulating film (reactive ion etching: RIE) and a method for forming the second and third insulating films.

The present inventors have found that it is possible to solve a conventional problem that the crystal defects occur owing to impurity cluster.

(A) In the state where the first insulating film to prevent the out diffusion of the impurities is laminated on the impurity diffusion region, the middle temperature heat treatmemt is preliminarily carried out. The first insulating film is once removed by RIE, and then the high temperature heat treatment (second heat treatment) is carried out (i.e., the heat treatment is carried out in a stress-free state in which there is no first insulating film). Subsequently, the second insulating film and the third insulating film such as a BPSG film are deposited again. The second insulating film is made of the same material as that of the first insulating film. Thereafter, the high temperature heat treatment (third heat treatment) is carried out for a good and flat shape. Consequently, there can be formed an impurity diffusion layer having no crystal defects.

Preferably used for the first and second insulating films is a film such as a NSG film, a HTO (high temperature oxide) film or a LTO (low temperature oxide) film which can prevent the out diffusion of the ions implanted in the semiconductor substrate.

(B) The middle temperature heat treatment is preliminarily carried out in the presence of silicon oxide as an ion implantation mask on the impurity diffusion region. Then, Cl ions are introduced into the impurity diffusion region. Thereafter, high temperature annealing is carried out. Consequently, the crystal defects, which occur owing to the impurity cluster, can be fused by ClO molecules in the impurity diffusion region on the semiconductor substrate. As a result, there can be reduced the crystal defects on the impurity diffusion layer.

According to yet another invention, if As ions are implanted through a $SiO_2$ film, extrinsic crystal defects occur on the Si substrate. The extrinsic crystal defects are not easily eliminated. However, if the N-rich SiN film is directly deposited on the Si substrate and the high temperature heat treatment is carried out, vacancy can forcibly be introduced so that a non-defective diffusion region may be formed. Thus, a leak current can be lowered to enhance a yield.

According to the present invention, (A) it is necessary to deposit the first insulating film such as the NSG film in order to prevent the out diffusion of the implanted ions. When the middle temperature heat treatment (first heat treatment) is carried out, the crystal defects occur in two lines, i.e., in the vicinity of a range distance (Rp) of ion implantation and on an amorphous/Si interface. When the high temperature heat treatment (second heat treatment) is then carried out, a stress is applied if the first insulating film is deposited on a junction layer. Consequently, the crystal defects cannot be fused. Accordingly, if the high temperature heat treatment (second heat treatment) is carried out with the first insulating film once removed, the crystal defects can be reduced in a stress-free state. Thus, the leak current is lowered so that the yield can be enhanced.

From another aspect, (B) (i) In the case where a SiN film is to be formed, silane compound gas containing chlorine such as $SiH_2Cl_2$ is always used so as to utilize Cl ions. After the Cl ions are implanted, the annealing is carried out for 30 minutes at a high temperature of 950° C. Thus, the crystal defects can be reduced.

(ii) The Cl ions can be implanted by $Cl_2$ or HCl gas. Also in this case, the high temperature annealing is carried out in similar to (i). Then, a $SiO_2$ film having no impurities and a $SiO_2$ film having impurities are sequentially laminated in accordance with an ordinary method. The high temperature annealing is carried out so that a flat layer insulation film is formed. In addition, a wiring layer is formed. Thus, a MOS memory cell can be produced.

To prevent the occurrence of the crystal defects, there are carried out (A) the second heat treatment and (B) the high temperature annealing after the Cl ions are implanted in the impurity diffusion region.

It is preferred that the above-mentioned heat treatments are carried out for 10 to 30 minutes at a temperature of 850° to 950° C. in a $N_2$ gas atmosphere.

Preferred embodiments of the present invention will be described in detail with reference to the drawings. The present invention is not limited to the embodiments to be described below.

Figure 1B:
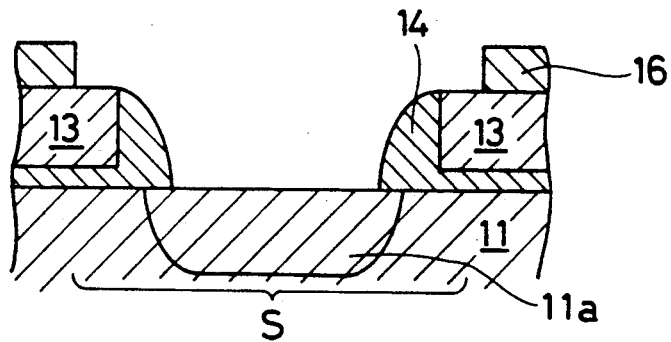
Figure 1C:
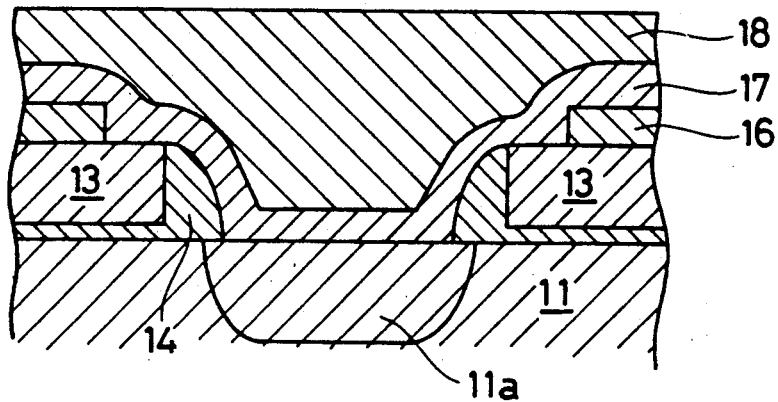

FIG. 1 shows a first embodiment of the present invention. As shown in FIG. 1 (a), a Si substrate (11) has a plurality of gate portions (10). The gate portion (10) has $SiO_2$ side walls (14) formed on a gate electrode (13). Impurities (for example, As, $BF_2$) ions (20) are implanted on the whole surface of the Si substrate (11) by using the gate portions (10) as masks. Then, a NSG film (first insulating film) (16) having a thickness d1 of 1000 Å is laminated. Thereafter, a heat treatment (first heat treatment) is carried out for 60 minutes at a middle temperature of about 800° C. in the $N_2$ gas atmosphere. Consequently, an impurity diffusion layer (11a) is formed.

As shown in FIG. 1 (b), there is removed only the NSG film (16) in a contact formation region (S) including the impurity diffusion layer (11a) between the gate portions. Then, the heat treatment (second heat treatment) is carried out for 30 minutes at a high temperature of about 950° C. in the $N_2$ gas atmosphere. Thus, the NSG film (16) is removed to carry out the high temperature heat treatment in a stress-free state, so that the crystal defects of the impurity diffusion layer (11a) can be reduced.

Then, a NSG film (second insulating film) (17) having a thickness d2 of 1500 Å is laminated again on the whole surface of the Si substrate including the contact formation region (S). Thereafter, a BPSG film (third insulating film) (18) for flattening is laminated on the whole surface. The heat treatment (third heat treatment) is carried out for 30 minutes at a high temperature of about 950° C. in the $N_2$ gas atmosphere so as to flatten the surface [see FIG. 1 (c)].

Subsequently, a contact hole is formed for metal wiring. Thus, a MOS memory cell can be produced.

According to the present embodiment, in the case where an impurity diffusion layer having a LDD structure is to be formed, NSG for preventing out diffusion is subjected to RIE and then to the high temperature heat treatment in the stress-free state. Consequently, there can be formed the diffusion region (11a) having no crystal defects.

As described above, in the case where a source-drain region is to be formed by the gate electrodes having the LDD structure in the MOS memory cell, the first insulating film is deposited on the implantation region in order to prevent the out diffusion of the impurities. Then, the middle temperature heat treatment is carried out to once remove the first insulating film. Thereafter, the implantation region is subjected to the high temperature heat treatment in the stress-free state. Consequently, there can be formed an implantation layer having no crystal defects. Thus, a leak current is lowered so that a yield can be enhanced.

Figure 2:
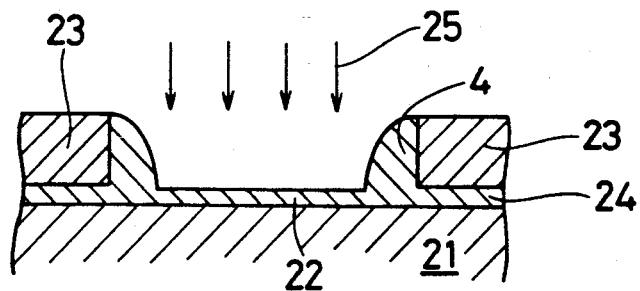
FIGS. 2(a)–2(c) are diagrams for explaining manufacturing steps according to a second embodiment of the present invention.
Figure 2:
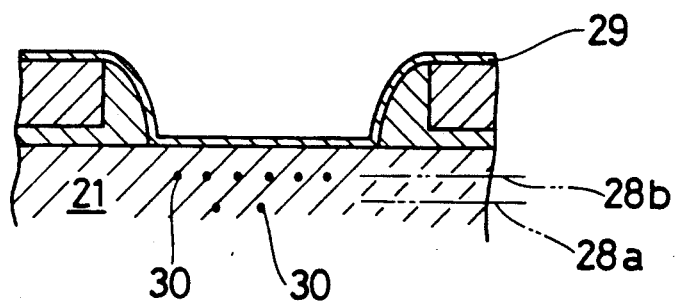
Figure 2:
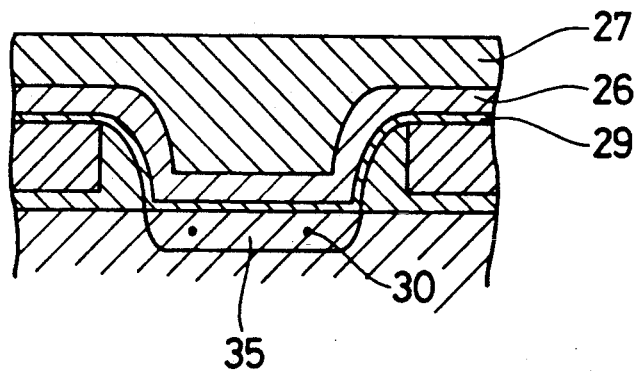

FIG. 2 is a diagram for explaining manufacturing steps according to a second embodiment of the present invention.

As shown in FIG. 2(a), a Si substrate (21) includes gates (23) and a SiO2 film (22). The gate (23) has SiO2 side walls (24). The SiO2 film (22) serves as a mask for As ion implantation between the gates (23) and (23). As As ions (25) are implanted in the Si substrate (21) at an accelerating energy of 80 KeV. Then, a heat treatment is carried out for 60 minutes at a middle temperature of 800° C.

The SiO2 film (22) is entirely removed from the Si substrate (21). Then, a SiN film (29) having a thickness of 80 to 150 Å is formed [see FIG. 2(b)].

After the middle temperature heat treatment is carried out, crystal defects (30) occur owing to As cluster in two lines, i.e., in the vicinity (28a) of Rp (478 Å) and an interface (28b) of amorphous Si and Si crystals. Cl ions in $SiH_2Cl_2$ gas are introduced as impurities into the Si substrate (21). The $SiH_2Cl_2$ gas is used when forming a SiN film. Then, a heat treatment is carried out for 30 minutes at a high temperature of 950° C. Consequently, the crystal defects (30) can be fused so as to be eliminated or reduced.

Thereafter, a NSG film (26) and a BPSG film (27) are sequentially laminated and then are subjected to the high temperature heat treatment for flattening. Consequently, there can be obtained an As ion diffusion layer (35) in which the crystal defects (30) are greatly reduced [see FIG. 2(c)].

According to the present embodiment, introduced as the impurities into the Si substrate are the Cl ions in $SiH_2Cl_2$ used when forming the SiN film. Then, the high temperature heat treatment is carried out. Consequently, there can be fused and reduced the crystal defects which occur owing to the As cluster. Thus, a leak current can be lowered.

FIG. 3 shows a third embodiment of the present invention in which a middle temperature heat treatment is carried out so as to diffuse As ions implanted in a Si substrate, a SiO2 film for an ion implantation mask is entirely removed, and high temperature annealing is carried out by using HCl gas for 30 minutes at a temperature of 950° C. so that Cl ions are implanted in the Si substrate.

Figure 3A:
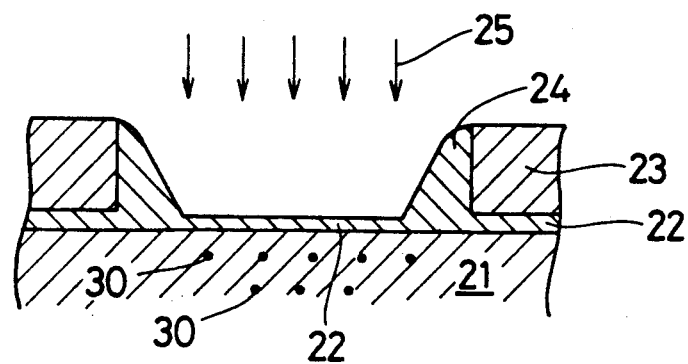
FIGS. 3(a)–3(c) are diagrams for explaining manufacturing steps according to a third embodiment of the present invention.

As shown in FIG. 3(a), As ions (25) are implanted, and then a SiO2 film (22) for the mask is entirely removed. Thereafter, HCl annealing is carried out for 30 minutes at a temperature of 950° C. [see FIG. 3(b)].

Subsequently, a NSG film (26) and a BPSG film (27) are laminated on the whole surface of the Si substrate, and then a high temperature heat treatment is carried out for flattening. Thus, an As ion diffusion layer (35) can be formed [see FIG. 3(c)].

Figure 3B:
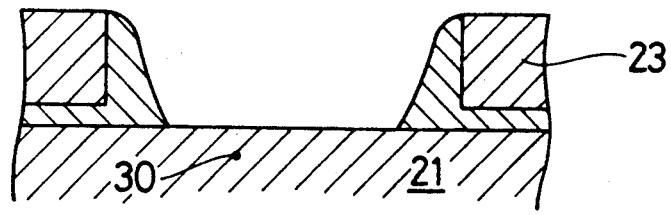
Figure 3C:
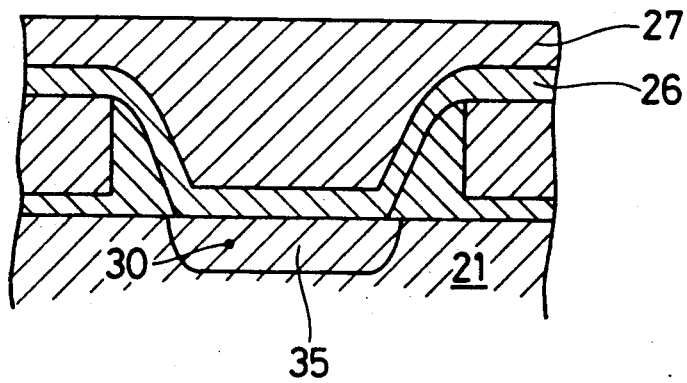
Figure 4:
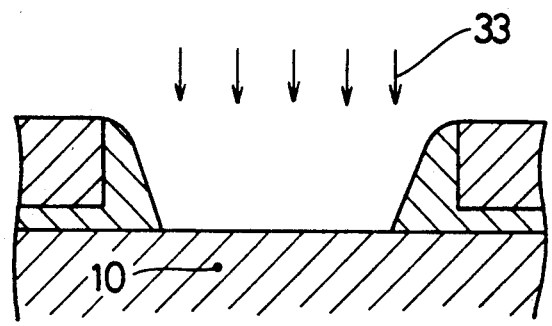
FIG. 4 is a diagram showing one of manufacturing steps according to a fourth embodiment of the present invention.
Figure 6A:
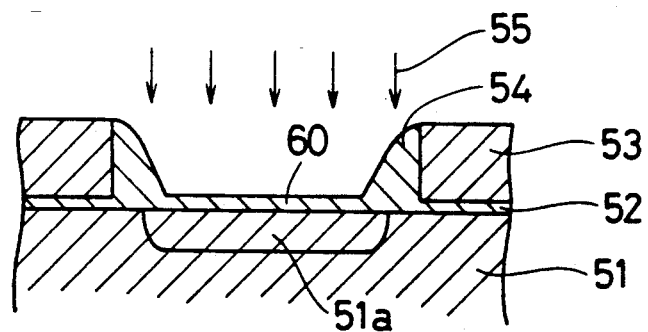
FIGS. 5(a)–5(c) and 6(a)–6(b) are diagrams for explaining manufacturing steps according to prior arts, respectively.
Figure 6B:
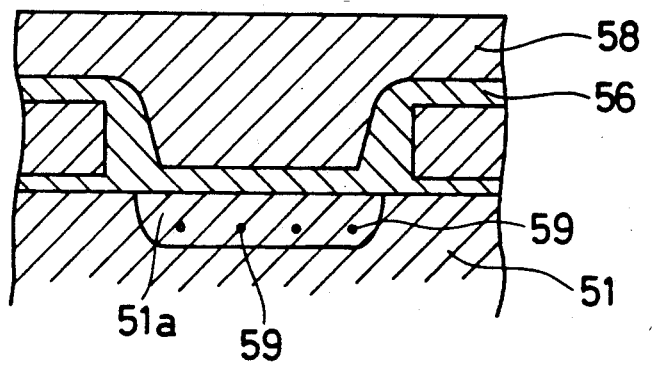
Figure 5A:
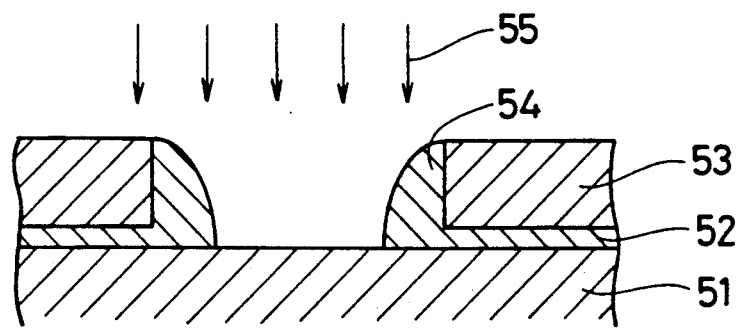
Figure 5B:
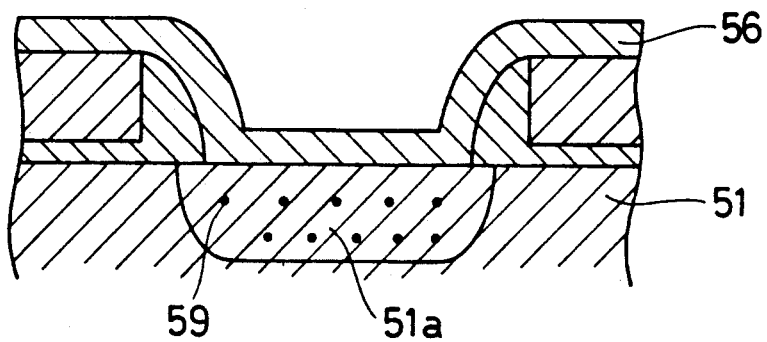
Figure 5C:
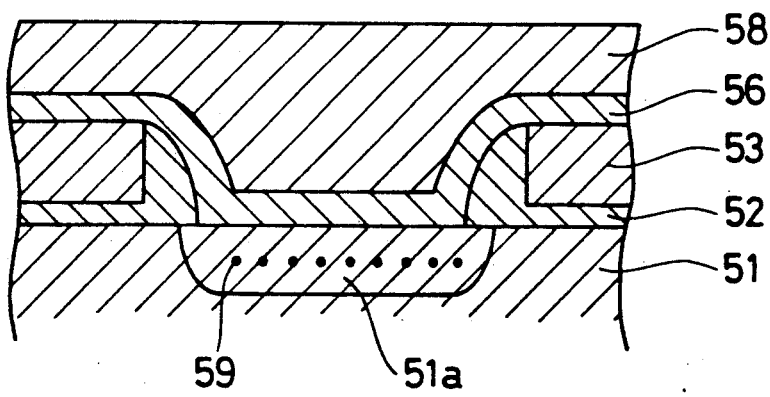

FIG. 4 shows a fourth embodiment of the present invention. As shown in FIG. 3(b), the SiO2 film (22) for the mask is entirely removed. Then, Cl ions (33) are implanted to carry out annealing for 30 minutes at a high temperature of 950° C. Consequently, the crystal defects, which occur owing to the As cluster, can be fused by ClO molecules. Thus, there can be produced a MOS memory cell having a non-defective As ion implantation layer.

According to the present invention, in the case where the source-drain region of the gate electrode having the LDD structure is to be formed by implanting the As ions, the As ions are diffused in the implantation region and then the SiO2 film is entirely removed in a mask portion for As ion implantation. Thereafter, (i) the SiN film is laminated and then the high temperature heat treatment is carried out, or (ii) the high temperature HCl annealing is carried out or the high temperature annealing is carried out by implanting the Cl ions. Consequently, the crystal defects can be reduced on the As ion diffusion layer. Thus, an electric leak is lowered so that a yield can be enhanced.

Figure 7A:
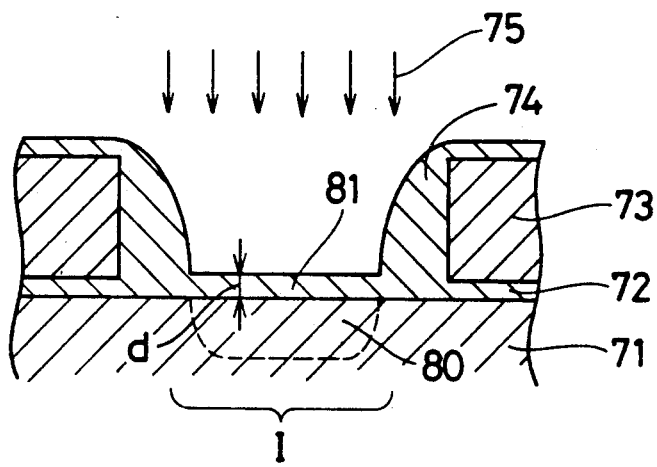
FIGS. 7(a)–7(c) are diagrams for explaining manufacturing steps according to a fifth embodiment of the present invention.
Figure 7B:
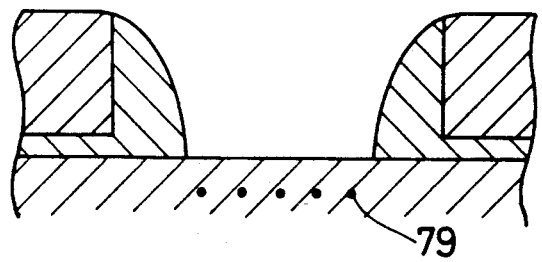
Figure 7C:
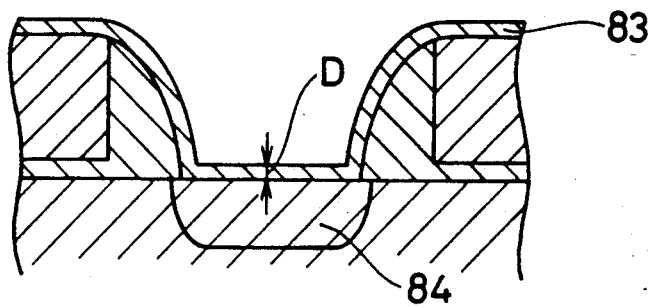

There will be described a fifth embodiment of the present invention. As shown in FIG. 7 (a), As ions are implanted on the whole surface of a Si substrate (71) at an accelerating energy of 80 Kev, $5 \times 10^{15}$ cm$^{-2}$ so as to form an ion implantation layer (80). The Si substrate (71) includes gate electrodes (73) having SiO2 side walls (74) through a SiO2 gate insulating film (72). In this case, a SiO2 film is deposited by a CVD method on the Si substrate (71) on which the gate electrodes (73) are provided by an ordinary method. The SiO2 side walls are formed on the gate electrode (73) by RIE and HF wet etching. Consequently, a SiO2 film (81) remains in an ion implantation layer region (I) on the Si substrate at a thickness d of about 100 to 400 Å. A heat treatment is carried out for about 60 minutes at a middle temperature, for example, of 800° C. in order to diffuse the As ions on the ion implantation layer (80). At this time, extrinsic crystal defects (79) occur [see FIG. 7 (b)]. It is necessary to forcibly introduce vacancy such that the crystal defects (79) are eliminated.

Then, the SiO2 film (81) is removed [see FIG. 7 (b)].

As shown in FIG. 7 (c), a N-rich SiN film (83) is deposited at a thickness D of 100 to 400 Å (the N-rich SiN film (83) is formed at a gas flow of $SiHCl_2$: $NH_4 = 1:4$ to 6 or $SiH_4:NH_4 = 1:4$ to 6). Finally, the heat treatment is carried out for 30 minutes at a high temperature of 950° C. Consequently, a source-drain region (84) can be formed.

What is claimed is:

1. A method for manufacturing a semiconductor device comprising steps of;
   (i) implanting impurity ions on the whole surface of a semiconductor substrate having a plurality of gate portions, in which side walls are formed on gate electrodes, by using the gate portions as masks, and then laminating a first insulating film over the gate portions and the substrate,
   (ii) carrying out a first heat treatment to diffuse the impurities implanted in the substrate and to form an impurity diffusion layer between the gate portions,
   (iii) removing the first insulating film in a contact formation region which substantially includes the impurity diffusion layer, (iv) carrying out a second heat treatment to reduce crystal defects on the impurity diffusion layer and laminating a second insulating film, which is made of the same material as that of the first insulating film, on the whole surface of the semiconductor substrate including the contact formation region again, and (v) laminating a third insulating film on the whole surface and then carrying out a third heat treatment to flatten the surface.

2. A method for manufacturing a semiconductor device according to claim 1, wherein the first insulating film is a Non-doped Silicate Glass film having no impurities.

3. A method for manufacturing a semiconductor device according to claim 1, wherein the first insulating film is removed by reactive ion etching.

4. A method for manufacturing a semiconductor device according to claim 1, wherein the second heat treatment is carried out for 10 to 30 minutes at a high temperature of 850° to 950° C. in a $N_2$ or HCl gas atmosphere.

5. A method for manufacturing a semiconductor device according to claim 1, wherein the first heat treatment is carried out for 40 to 60 minutes at a middle temperature of 750° to 850° C. in the $N_2$ gas atmosphere.

* * * * *